United States Patent [19]
Kim et al.

[11] Patent Number: 5,825,698
[45] Date of Patent: Oct. 20, 1998

[54] REDUNDANCY DECODING CIRCUIT FOR A SEMICONDUCTOR MEMORY DEVICE

[75] Inventors: Chang-Rae Kim; Jong-Young Kim; Hee-Choul Park, all of Seoul, Rep. of Korea

[73] Assignee: Samsung Electronics, Co., Ltd., Suwon, Rep. of Korea

[21] Appl. No.: 961,052

[22] Filed: Oct. 30, 1997

[30] Foreign Application Priority Data

Oct. 30, 1996 [KR] Rep. of Korea .................. 96-50270

[51] Int. Cl.[6] ................................................ G11C 7/00
[52] U.S. Cl. .................. 365/200; 365/230.06; 365/225.7
[58] Field of Search .............................. 365/200, 230.06, 365/225.7, 96

[56] References Cited

U.S. PATENT DOCUMENTS 5,574,689  11/1996  Morgan ........................ 365/200
5,590,085  12/1996  Yuh et al. ..................... 365/200

*Primary Examiner*—Vu A. Le
*Attorney, Agent, or Firm*—Marger, Johnson, McCollom, & Stolowitz P.C.

[57] ABSTRACT

A redundancy decoding circuit for a semiconductor memory device is shown which includes a comparator which decodes and outputs a redundant memory cell address in response to an address signal, where the comparator includes internal fuses that are coupled to an output terminal of the comparator and which can be selectively cut in order to determine the redundant memory cell address. The redundancy decoding circuit also includes a driving unit which supplies a driving current to the output terminal of the comparator in response to a switching control signal. A pulse generator generates a power up pulse having a predetermined width responsive to power up of the redundancy decoding circuit. A switching control signal generator, which includes a master fuse connected in series with a switching element, generates the switching control signal at a predetermined voltage level in response to the power up pulse generated by the pulse generator even when the master fuse is incompletely cut.

6 Claims, 4 Drawing Sheets

REDUNDANCY DECODING CIRCUIT FOR A SEMICONDUCTOR MEMORY DEVICE

BACKGROUND OF THE INVENTION

1. Field of the Invention

The present invention relates to a redundancy decoding circuit used in a semiconductor memory device in a semiconductor memory device having memory cell redundancy and, more particularly, to a redundancy decoding circuit for preventing decoded address failure.

2. Description of the Related Art

Typically, a semiconductor memory device includes redundant memory cells which are substituted for defective memory cells in the device. In order to substitute a redundant cell for a defective memory cell, a redundancy decoding circuit is required to generate a redundant address which designates the substituted redundant cell instead of the defective cell.

FIG. 1 is a circuit diagram illustrating a conventional redundancy decoding circuit 100. The redundancy decoding circuit 100 of FIG. 1 includes of a series of transistors, fuses which are capable of being selectively cut or blown, and a high impedance resistor. A comparator 20, which includes internal fuses F1–F4, N-channel metal-oxide semiconductor (NMOS) transistors N1–N4 and inverters I1 and I2, performs the function of decoding a redundant address applied to comparator 20 through the redundant address input terminals RA1B and RA0B and outputting a result which is dependent upon the selective cutting of the internal fuses F1–F4 connected to an output terminal L1.

The redundancy decoding circuit of FIG. 1 also includes a driving unit, composed of p-channel metal oxide semiconductor (PMOS) transistors MP1 and MP2, and NMOS transistor MN1, which supplies a driving current to the output terminal L1 of the comparator 20. A signal DESELROW is applied in common to gates of the PMOS transistor MP2 and the NMOS transistor MN1. The DESELROW signal is active as a logic "low" level signal when decoding a redundant address.

A switching control signal generator allows the driving unit composed of transistors MP1, MP2 and MN1 to drive comparator 20 by applying a switching control signal to the gate of the PMOS transistor MP1. The switching control signal generator is composed of a master fuse MF (which is also capable of being selectively cut) and a high impedance resistor R1 fabricated from a polysilicon material connected in series between a power supply voltage $V_{cc}$ and a ground potential.

A latch 10 is coupled between the gate of PMOS transistor MP1 and the common node between master fuse MF and resistor R1. Latch 10 is also connected between the gate of the PMOS transistor MP1 and the ground potential so as to latch the switching control signal at the gate terminal of the MP1 to a low logic level.

In order to enable a redundant cell instead of a defective memory cell responsive to an address using the circuit of FIG. 1, the master fuse MF and a portion of the internal fuses F1–F4 must be opened. While the semiconductor memory device is still in the wafer state, the master fuse MF, along with the appropriate ones of internal fuses F1–F4, is cut or blown using a laser beam or a high voltage. By cutting the master fuse MF, the gate of the PMOS transistor MP1 within the driving unit becomes a low level which causes transistor MP1 to turn on and allow the flow of driving current to the output terminal L1 of comparator 20 thus enabling comparator 20. Thereafter, when the DESELROW signal is activated as a logic "low" level in order to initiate decoding of a redundant address, the voltage level of the power supply voltage VCC is supplied to the output terminal L1. Subsequently, comparator 20 decodes and outputs the address applied through the redundant address input terminals RA1B and RA0B and generates a redundant address result at output terminal L1 which corresponds to a redundant memory cell and depends upon which of the internal fuses F1–F4 were cut.

The master fuse MF is typically fabricated using a compound of polysilicon or metal which is opened using a laser beam or a high voltage. However, when the fuse is cut or blown to create an open circuit, particles of the silicide material constituting the fuse often remain in the region of the master fuse MF. As a consequence, particles of the fuse material can conduct current and cause PMOS transistor MP1 to remain turned off or the operation of transistor MP1 can become unpredictable resulting in address decoding errors in comparator 20. Accordingly, there has been a problem in conventional semiconductor memory devices wherein fuse material which remains after the cutting of the master fuse causes address decoding errors and decreases the reliability of the redundancy decoding circuit.

SUMMARY OF THE INVENTION

Therefore, it is an object of the present invention to provide a redundancy decoding circuit capable of reducing address decoding errors generated due to material remaining after the cutting of a fuse.

To accomplish these and other objects, the present invention provides a redundancy decoding circuit which includes a comparator for decoding and outputting a redundant address, wherein the comparator includes internal fuses coupled to an output terminal thereof, and further wherein the internal fuses are configured to be selectively cut in order to determine the redundant address. The redundancy decoding circuit also includes a driving unit configured to supply a driving current to the output terminal of the comparator in response to a switching control signal. A pulse generator generates a power up pulse having a predetermined width responsive to power up of the redundancy decoding circuit. The switching control signal generator includes a master fuse and a switching element coupled in series wherein a control terminal of the switching element is configured to receive the power up pulse generated by the pulse generator whereby the switching control signal is generated at the predetermined voltage level even when the master fuse is incompletely cut.

An embodiment of a method for generating a redundant memory cell address in a semiconductor memory device, according to the present invention, includes providing a comparator configured to output a redundant address, the comparator having internal fuses which may be selectively cut to determine the redundant address, coupling a switching element in series with a master fuse. The method also includes cutting the internal fuses and the master fuse to correspond to a predetermined redundant address, generating a power up reset pulse signal responsive to a power up of the semiconductor memory device, driving the switching element responsive to the power up reset pulse signal to produce a switching control signal having a predetermined voltage level, generating a driving current responsive to the switching control signal, and driving an output terminal of the comparator using the driving current.

BRIEF DESCRIPTION OF THE DRAWINGS

These and various features and advantages of the present invention will be readily understood with reference to the following detailed description taken in conjunction with the accompanying drawings, wherein.

DETAILED DESCRIPTION OF THE PREFERRED EMBODIMENT

A preferred embodiment of the present invention will now be described in detail with reference to the accompanying drawings.

Figure 1:
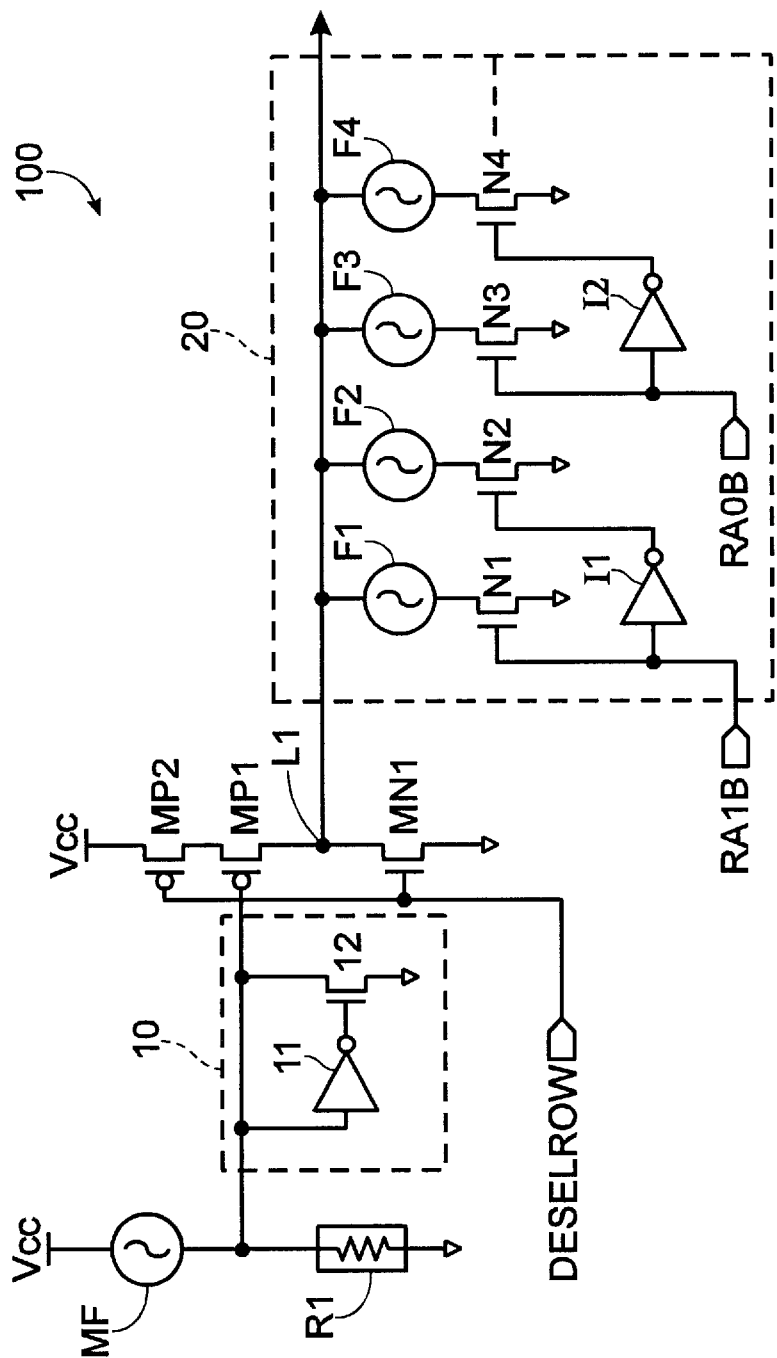
FIG. 1 is a diagram illustrating a conventional redundancy decoding circuit.
Figure 2:
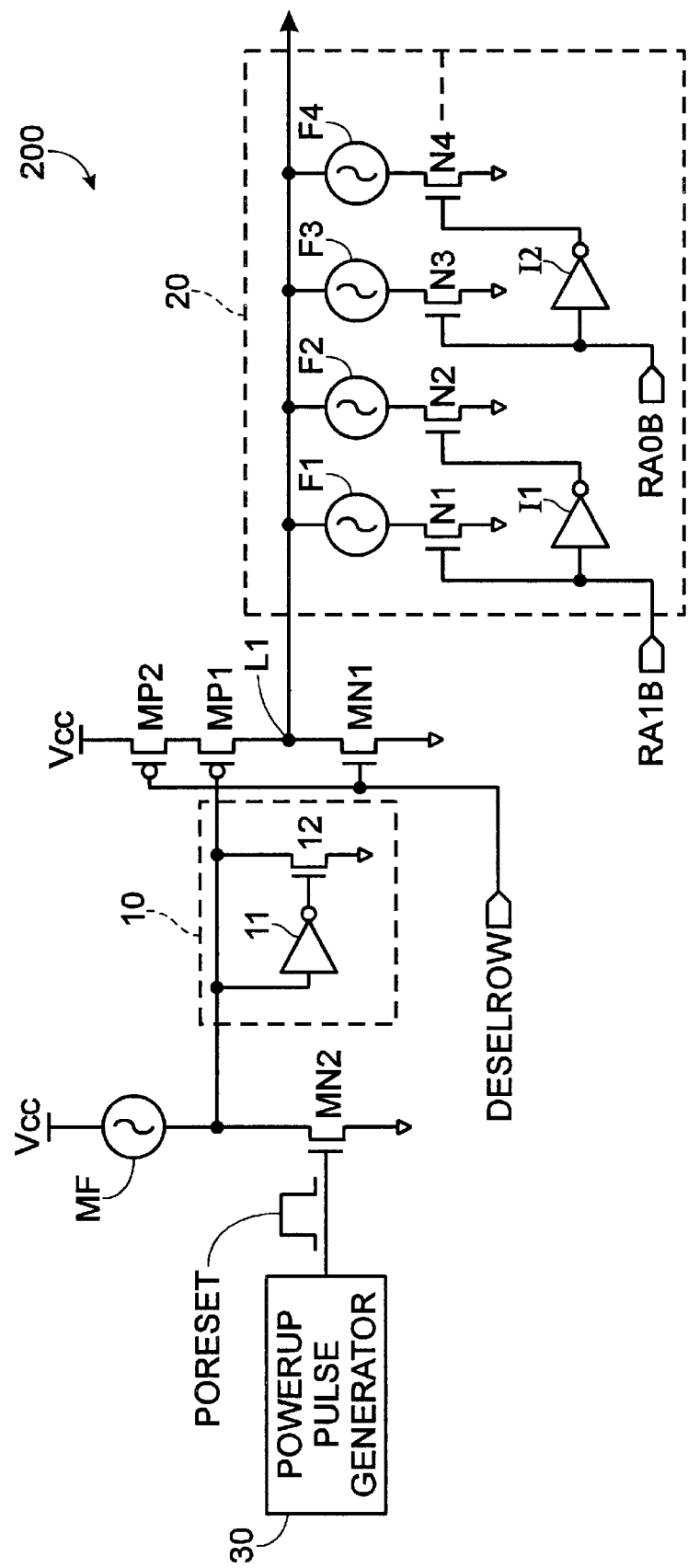
FIG. 2 is a diagram illustrating an embodiment of a redundancy decoding circuit according to the present invention.

FIG. 2 illustrates an embodiment of a redundancy decoding circuit 200 according to the present invention. The circuit 200 of FIG. 2 is similar of that of the conventional circuit 100 of FIG. 1 discussed above except that the circuit of FIG. 2 also includes a power up pulse generator 30 which generates a power-on reset signal PORESET and an NMOS transistor MN2 which receives the PORESET signal at its gate terminal. In order to address the effect of incompletely cutting the master fuse MF, the high impedance resistor R1 of FIG. 1 is replaced by transistor MN2. Transistor MN2 is controlled by a pulse of the PORESET signal having a predetermined width that is generated by power up pulse generator 30 upon power-up of the semiconductor memory device. Transistor MN2 is connected in series with the master fuse MF and responds to the PORESET pulse by discharging the voltage at the drain terminal of transistor MN2, which is the common node with the master fuse MF, to ground.

The master fuse MF and transistor MN2 operate as a switching control signal generator since the master fuse MF and the transistor MN2 supply a switching control signal to the driving unit composed of transistors MP1, MP2 and MN1. Accordingly, even when the master fuse MF is incompletely cut, the high level PORESET pulse applied to the gate of transistor MN2 supplies a low level switching control signal to the gate of transistor MP1. Accordingly, a sufficient level of current is supplied to the output terminal L1 of the comparator 20 by the driving unit in order to normalize the redundancy address decoding signal output by comparator 20.

Figure 3:
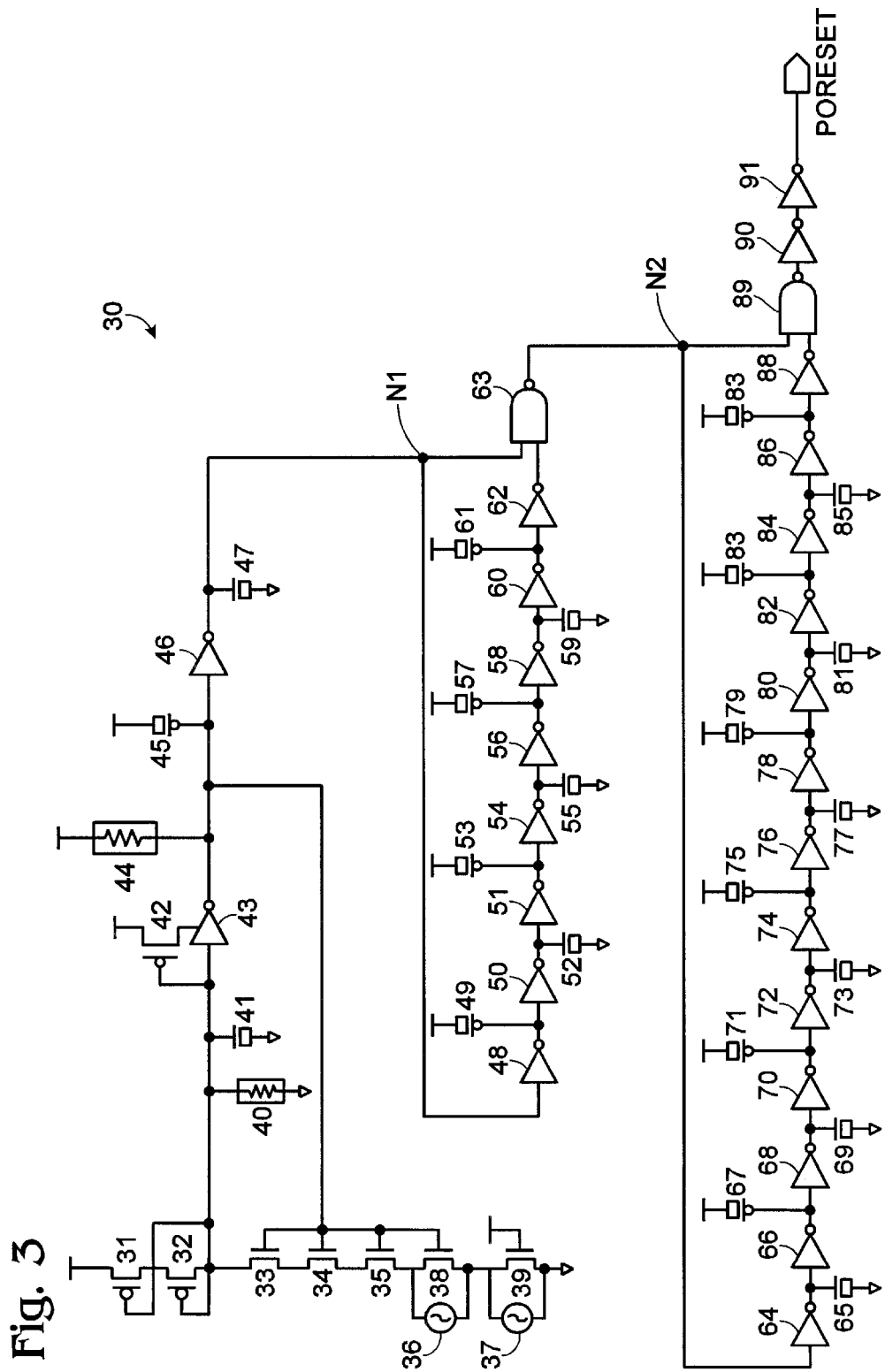
FIG. 3 is detailed circuit diagram illustrating a power up pulse generator of FIG. 2.

FIG. 3 is detailed circuit diagram illustrating an embodiment of the power up pulse generator 30 of FIG. 2. Referring to FIG. 3, the power up pulse generator 30 is made up of a first delay unit for supplying a first delay pulse to a node N2; a second delay unit for supplying a second pulse to a NAND gate 89; and power-up detector circuitry for supplying a power up response signal to a node N1. The power up detector circuitry consists of PMOS transistors 31 and 32 and NMOS transistors 31, 32, 33, 34, 35, 38, 39 and 42 connected in series with one another between the supply voltage and the ground potential. The gate terminals of each of PMOS transistors 31 and 32 are coupled to the source terminal of PMOS transistor 32. A pair of inverters are connected in series between the source terminal of PMOS transistor 32 and a circuit node N1. The power-up detector circuitry also includes high impedance resistor 40 and NMOS capacitor 41, which are each connected between the ground potential and the source terminal of PMOS transistor 32, and high impedance resistor 44 and PMOS capacitor 45, which are each connected between the supply voltage and the output terminal of invertor 43. The output terminal of invertor 43 is also coupled to the gate terminals of NMOS transistors 33, 34, 35 and 38. PMOS transistor 42 is coupled between the power supply and the power terminal of invertor 43 where the gate terminal of PMOS transistor 42 is coupled to the input of invertor 43. An NMOS capacitor 47 is coupled between the output of invertor 44 and the ground potential. Fuses 36 and 37 are coupled in parallel with NMOS transistors 38 and 39 respectively and may be selectively inserted into the power up detector circuitry.

The first delay unit is composed of an invertor chain constructed of inverters 48, 50, 51, 54, 56, 58, 60 and 62. PMOS capacitors 49, 53, 57 and 61 are coupled between the power supply voltage and the output terminals of inverters 48, 51, 56 and 60, respectively. NMOS capacitors 52, 55 and 59 are coupled between the ground potential and the output terminals of inverters 50, 54 and 58, respectively. NAND gate 63 has one input terminal coupled to circuit node N1, which is also coupled to the input terminal of invertor 48 and which is the input of the delay unit. Another input terminal of NAND gate 63 is coupled to the output terminal of invertor 62. The output terminal of NAND gate 63 produces a pulse at a circuit node N2 in response to a rising voltage on circuit node N1 wherein the pulse has a width determined by the delay of the invertor chain of the first delay unit.

The second delay unit consists of another invertor chain constructed of inverters 64, 66, 68, 70, 72, 74, 76, 78, 80, 82, 84, 86 and 88. PMOS capacitors 67, 71, 75, 79, 83 and 87 are coupled between the power supply voltage and the output terminals of inverters 66, 70, 74, 78, 82 and 86, respectively. NMOS capacitors 65, 69, 73, 77, 81 and 85 are coupled between the ground potential and the output terminals of inverters 64, 68, 72, 76, 80 and 84. A second NAND gate 89 has one input terminal coupled to circuit node N2 and the input of invertor 64, which is also the input of the chain of inverters. The other input terminal of NAND 89 is coupled to the output terminal of invertor 88. The voltage transition generated by NAND gate 63 at circuit node N2 is delayed by the second chain of inverters and results in a PORESET pulse generated at the output of NAND gate 89 which propagates through inverters 90 and 91. The circuit of FIG. 3 represents only one embodiment of a pulse generator suitable for use in the present invention and other pulse generators can also be used, such as an address shift detecting circuit.

Figure 4:
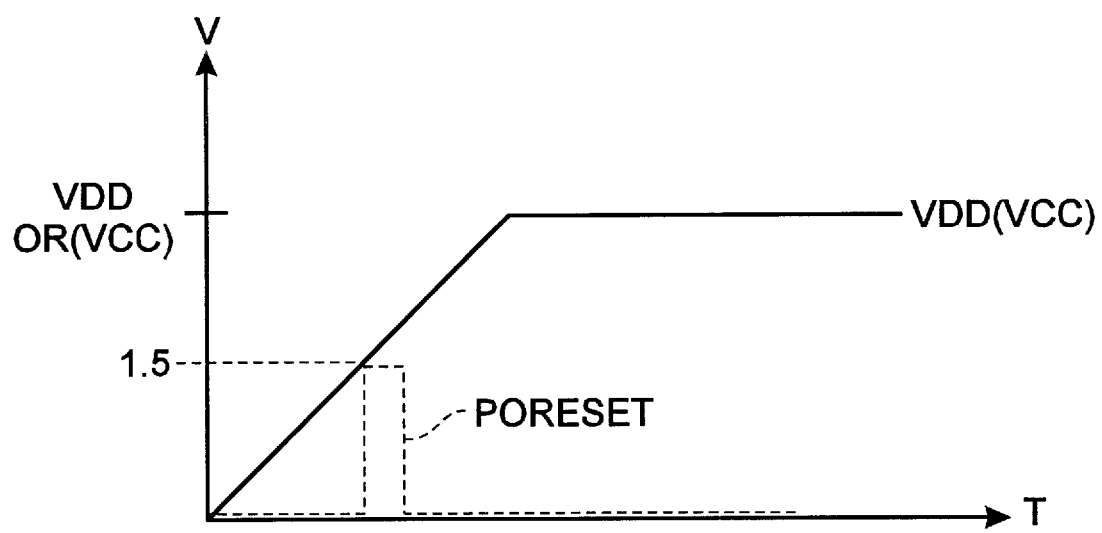
FIG. 4 is a simulated wave-form diagram illustrating operation of the power up pulse generator of FIG. 3.

FIG. 4 is a wave-form diagram illustrating a simulation of PORESET signal pulse generated by the pulse generator 30 of FIG. 3. Referring to FIG. 4, the power supply voltage Vdd increases from the ground potential voltage level when power is first applied and, after a short delay, reaches a voltage level of about 1.5V causing the PORESET pulse to be generated. The voltage level of 1.5V described above is exemplary only and can be manipulated to generate the PORESET pulse at different voltage levels by varying the number of transistors in series between the ground potential and the source terminal of transistor 32. For instance, the voltage level at which the PORESET pulse is generated can be adjusted by selectively cutting one or both of internal fuses 36 and 37.

Accordingly, in the circuit according the present invention shown in FIGS. 2 and 3, even when the master fuse MF is incompletely cut, a high logic level PORESET pulse signal is applied to the gate of transistor MN2 of FIG. 2 in order to produce a switching control signal to the gate of transistor MP1 that is a low logic level. The level of current supplied to the output terminal L1 of comparator 20 is thereby normalized in order to normalize the output of the decoding function performed by comparator 20. The present invention, as herein described, has the advantage that address decoding errors generated due to particles remaining in the region of the master fuse MF after the master fuse is cut are reduced.

What is claimed is:

1. A redundancy decoding circuit, comprising:

a comparator for decoding and outputting a redundant address, wherein the comparator includes internal fuses coupled to an output terminal thereof, and further wherein the internal fuses are configured to be selectively cut in order to determine the redundant address;

a driving unit configured to supply a driving current to the output terminal of the comparator in response to a switching control signal;

a pulse generator configured to generate a power up pulse having a predetermined width responsive to power up of the redundancy decoding circuit;

a switching control signal generator configured to generate the switching control signal at a predetermined voltage level, wherein the switching control signal generator includes a master fuse and a switching element, the master fuse being coupled between a power supply terminal and a first terminal of the switching element and a second terminal of the switching element being coupled to a ground potential terminal, and wherein a control terminal of the switching element is configured to receive the power up pulse generated by the pulse generator whereby the switching control signal is generated at the predetermined voltage level even when the master fuse is incompletely cut.

2. The circuit of claim 1, wherein said switching element is a MOS transistor and a gate terminal of the MOS transistor is configured to receive the power up pulse.

3. The circuit of claim 1, wherein said pulse generator further comprises:

a power up detector configured to detect a power up condition and generate a power up signal responsive thereto;

a first delay unit configured to receive the power up signal and, responsive thereto, generate a first delay pulse; and a second delay unit configured to receive the first delay pulse and, responsive thereto, generate the power up pulse.

4. The circuit of claim 1, further including:

a latch coupled between said driving unit and said switching control signal generator and being configured to latch the switching control signal.

5. A method for generating a redundant memory cell address in a semiconductor memory device, the method comprising the steps:

providing a comparator configured to output a redundant address, the comparator having internal fuses which may be selectively cut to determine the redundant address;

coupling a switching element in series with a master fuse;

cutting the internal fuses and the master fuse to correspond to a predetermined redundant address;

generating a power up reset pulse signal responsive to a power up of the semiconductor memory device;

driving the switching element responsive to the power up reset pulse signal to produce a switching control signal having a predetermined voltage level;

generating a driving current responsive to the switching control signal; and driving an output terminal of the comparator using the driving current.

6. The method of claim 5 further including the step of latching the switching control signal.

\* \* \* \* \*